(12) United States Patent
Carlson et al.

(10) Patent No.: US 8,313,804 B2
(45) Date of Patent: Nov. 20, 2012

(54) APPARATUS AND METHODS FOR CHEMICAL VAPOR DEPOSITION

(75) Inventors: David K. Carlson, San Jose, CA (US); Errol Sanchez, Tracy, CA (US); Satheesh Kuppurao, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/109,533

(22) Filed: May 17, 2011

(65) Prior Publication Data

US 2011/0217466 A1    Sep. 8, 2011

Related U.S. Application Data

(62) Division of application No. 11/697,937, filed on Apr. 9, 2007, now Pat. No. 7,967,911.

(60) Provisional application No. 60/791,230, filed on Apr. 11, 2006.

(51) Int. Cl.
  *C23C 16/44*  (2006.01)
  *C23C 16/448*  (2006.01)
  *C23C 16/38*  (2006.01)
  *C23C 16/30*  (2006.01)
(52) U.S. Cl. ............. 427/248.1; 427/237; 427/497
(58) Field of Classification Search .......... 427/237, 427/248.1, 497
See application file for complete search history.

(56) References Cited

U.S. PATENT DOCUMENTS

| 4,232,063 | A |   | 11/1980 | Rosler et al. |
| 4,496,609 | A |   | 1/1985  | McNeilly et al. |
| 4,579,080 | A |   | 4/1986  | Martin et al. |
| 5,000,113 | A |   | 3/1991  | Wang et al. |
| 5,037,624 | A | * | 8/1991  | Tom et al. ............... 423/210 |
| 6,444,038 | B1 |   | 9/2002  | Rangarajan |
| 6,921,062 | B2 | * | 7/2005  | Gregg et al. ............ 261/23.1 |
| 7,967,911 | B2 | * | 6/2011  | Carlson et al. ........... 118/726 |
| 2002/0078894 | A1 | * | 6/2002 | Timmons et al. .......... 118/726 |
| 2003/0116019 | A1 | * | 6/2003 | Torkaman ................. 95/226 |
| 2004/0016404 | A1 | * | 1/2004 | Gregg et al. ............. 118/726 |
| 2006/0219177 | A1 |   | 10/2006 | Brcka |

FOREIGN PATENT DOCUMENTS

| EP | 1548813 A1 | 6/2005 |
| JP | 60-131973  | 7/1985 |
| JP | 11-006065  | 1/1999 |
| JP | 2001115263 | 4/2001 |

OTHER PUBLICATIONS

IPRP, PCT/US2007/066366 Oct. 14, 2008, 10 pp.
PCT International Search Report, Nov. 4, 2007.
Timmons, M. "A Study of cylinder design for solid OMVPE sources", *Journal of Crystal Growth*, Elsevier vol. 221, No. 1-4 (200-12) Amsterdam, NL Dec. 2000, 635-639.

* cited by examiner

*Primary Examiner* — Rudy Zervigon
(74) *Attorney, Agent, or Firm* — Diehl Servilla LLC

(57) ABSTRACT

Methods and apparatus are disclosed for the formation of vaporizing liquid precursor materials. The methods or apparatus can be used as part of a chemical vapor deposition apparatus or system, for example for forming films on substrates. The methods and apparatus involve providing a vessel for containing a liquid precursor and diffusing element having external cross-section dimensions substantially equal to the internal cross-sectional dimensions of the vessel.

18 Claims, 2 Drawing Sheets

APPARATUS AND METHODS FOR CHEMICAL VAPOR DEPOSITION

CROSS-REFERENCE TO RELATED APPLICATIONS

This application is a divisional of U.S. patent application Ser. No. 11/697,937, filed on Apr. 9, 2007 which claims priority under 35 U.S.C. 119(e) to U.S. Provisional Application No. 60/791,230, filed Apr. 11, 2006.

BACKGROUND

Embodiments of the present invention pertain generally to apparatus and methods for vaporizing and mixing a vaporized liquid with a carrier gas. Embodiments of the invention are particularly suited for supplying vaporized reactants to the reaction chamber of a chemical vapor deposition system, for example, in semiconductor device manufacturing equipment.

Chemical vapor deposition (CVD) processes are widely used in the deposition of thin films used in semiconductor devices and integrated circuits. Such processes involve deposition resulting from a reaction of chemical vapors homogeneously or heterogeneously on a substrate. The reaction rate is controlled by one or more parameters, such as temperature, pressure and reactant gas flow rates. The use of low vapor pressure liquids as precursors for such processes has several advantages and has become more common.

Prior CVD processes involve transport of low vapor pressure liquid using a bubbler or boiler. In these processes, a carrier gas saturates the liquid and transports the vapor. Various liquid reactants and precursors are used in CVD applications by delivering the liquid reactants in a carrier gas. In liquid reactant CVD systems, the carrier gas is typically bubbled at a controlled rate through a container of the liquid reactant so as to saturate the carrier gas with liquid reactant and the saturated carrier is then transported to the reaction chamber.

Attempts have been made to deliver solid reactants to a CVD reaction chamber, but with much less success. The delivery of solid precursors in CVD processing is carried out using the sublimator/bubbler method in which the precursor is usually placed in a sublimator/bubbler reservoir which is then heated to the sublimation temperature of the precursor to transform it into a gaseous compound which is transported into the CVD reactor with a carrier gas such as hydrogen, helium, argon, or nitrogen. However, this procedure has been unsuccessful in reliably and reproducibly delivering solid precursor to the reaction chamber for a number of reasons. The major problems with the technique are centered on the inability to consistently vaporize a solid at a controlled rate such that a reproducible flow of vaporized solid precursor can be delivered to the process chamber. Also, it is difficult to ensure complete saturation of the fast flowing carrier gas stream because of a limited amount of exposed surface area of the solid precursor in the vaporizer system and lack of uniform temperature to provide maximum sublimation. Although solid precursor sublimator/bubbler systems and liquid precursor bubbler systems are both used for the delivery of CVD reactants, each of these systems has different problems and considerations. Therefore, a system or apparatus used for a solid sublimator/bubbler will not necessarily work for a liquid precursor bubbler apparatus.

Prior art apparatus for delivering the vapor formed by bubbling a carrier gas through a liquid precursor are shown in FIGS. 1A and 1B. FIG. 1A shows a prior art vaporizer apparatus 10 including an ampoule or vessel 12 containing a liquid precursor material 11. Gas inlet tube 14 is connected to a source of carrier gas 30. Gas inlet tube 14 extends beneath the level of liquid 11. Pressurized delivery of carrier gas 30 provides a mixture 32 of vaporized liquid precursor and carrier gas which then exits the vessel 12 through outlet conduit 16, which is connected to a CVD system (not shown).

The diffuser material 20 is typically a porous, sintered metal, and improves the bubbling efficiency of the vaporizer apparatus 10. The vaporizers shown in FIGS. 1A and 1B deliver vapor from material in a liquid state to a process chamber by heating the liquid material in a container and introducing the carrier gas at a controlled rate into the liquid material near the bottom of the container. The carrier gas then becomes saturated with vapor from the liquid material as the carrier gas bubbles to the top of the container. The saturated carrier gas is then transported to the process chamber, for example, a CVD apparatus used in semiconductor manufacture.

In the apparatus shown in FIGS. 1A and 1B, bubbles of carrier gas produce undesirable small droplets of the liquid precursor, which may be referred to as microdroplets. The microdroplets are carried together with the mixture of carrier gas and precursor vapor into the outlet tube and to the process chamber. Such microdroplets can cause defects in the finished products.

A need therefore remains for liquid vaporizer methods and apparatus which can vaporize liquid at flow rates sufficient for CVD processes and that reduce or prevent the delivery of small droplets of liquid to the process chamber.

SUMMARY

Embodiments of the invention relate to apparatus and methods of processing a wafer during a film-forming process in a reaction chamber. According to a first embodiment, a chemical vapor deposition apparatus comprises a chemical vapor deposition chamber having a gas inlet port and a liquid reactant vaporizer. The liquid reactant vaporizer has an outlet port connected to the chamber inlet port. The vaporizer comprises a vessel including an upper portion, a lower portion, interior lateral surfaces and a bottom surface. According to the first embodiment, the vessel contains a liquid reactant, and the space between the interior lateral surfaces defines an interior vessel diameter. The apparatus further includes an inlet port connected to a source of carrier gas, a porous member having external diameter that is substantially equal to the interior diameter of the vessel inserted into the lower portion of the vessel below the level of the liquid reactant and defining a plenum between the porous member and the bottom of the vessel, and a gas delivery conduit extending through the gas inlet port and the porous member.

The plenum is defined by a gap between the porous member and the bottom of the vessel. In certain embodiments, the porous member is in the shape of a disk. According to some embodiments, the disk is composed of sintered metal, for example, a sintered metal frit, such as a stainless steel frit. In one or more embodiments, the apparatus is adapted for the formation of films on substrates.

Another embodiment pertains to a chemical vapor deposition apparatus comprising a chemical vapor deposition reaction chamber and a vaporizer. The vaporizer includes a closed substantially cylindrical ampoule having a top portion, a bottom portion, a bottom surface and an interior diameter bound by interior walls, inlet and outlet ports extending from the top portion, the outlet port in fluid communication with the reaction chamber and the inlet port in fluid communication with a gas source. The vaporizer further includes a porous plate having edge surfaces in contact with the interior walls of the ampoule adjacent the bottom surface and submerged in liquid reactant, the porous plate being mounted to provide a space between the plate and the bottom surface and a gas conduit extending from the inlet and through the porous plate. In certain embodiments, the space between the plate and the bottom surface is at least about 2 mm.

Still another embodiment of the invention pertains to a chemical vapor deposition method comprising flowing a carrier gas through a liquid reactant contained in a vessel defined by walls and a bottom surface, the vessel including a porous member extending between the walls of the vessel and defining a plenum in a bottom portion of the vessel, the porous member submerged in the liquid reactant, causing the carrier gas and the liquid reactant to flow through the porous member to create a vapor from the liquid and transporting the vapor to a chamber under conditions to convert the liquid reactant to form a layer on a substrate contained within the chamber. In one or more embodiments, the porous member comprises a sintered frit, for example, a sintered metal frit, such as a sintered stainless steel frit.

DETAILED DESCRIPTION

Before describing exemplary embodiments of the invention, it is to be understood that the invention is not limited to the details of construction or process steps set forth in the following description. The invention is capable of other embodiments and of being practiced or being carried out in various ways. Aspects of the present invention provide methods and apparatus for chemical vapor deposition, which may be used, for example, for forming thin films on a substrate.

Figure 1A:
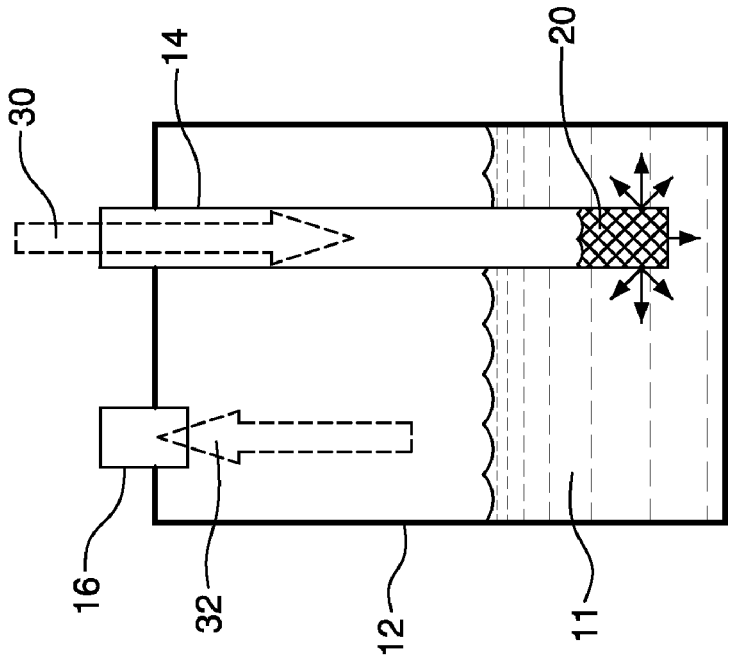
FIG. 1A shows a prior art vaporizer apparatus.
Figure 1B:
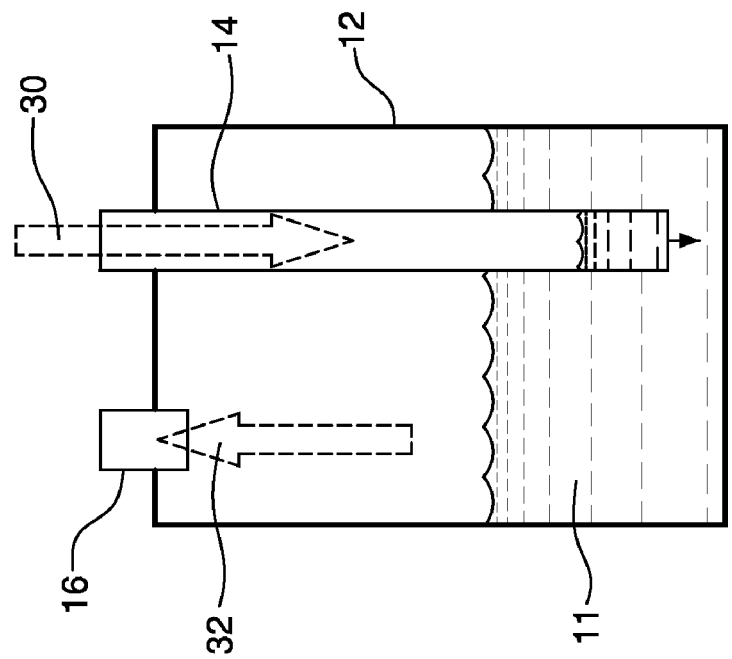
FIG. 1B shows a prior art vaporizer apparatus.
Figure 2:
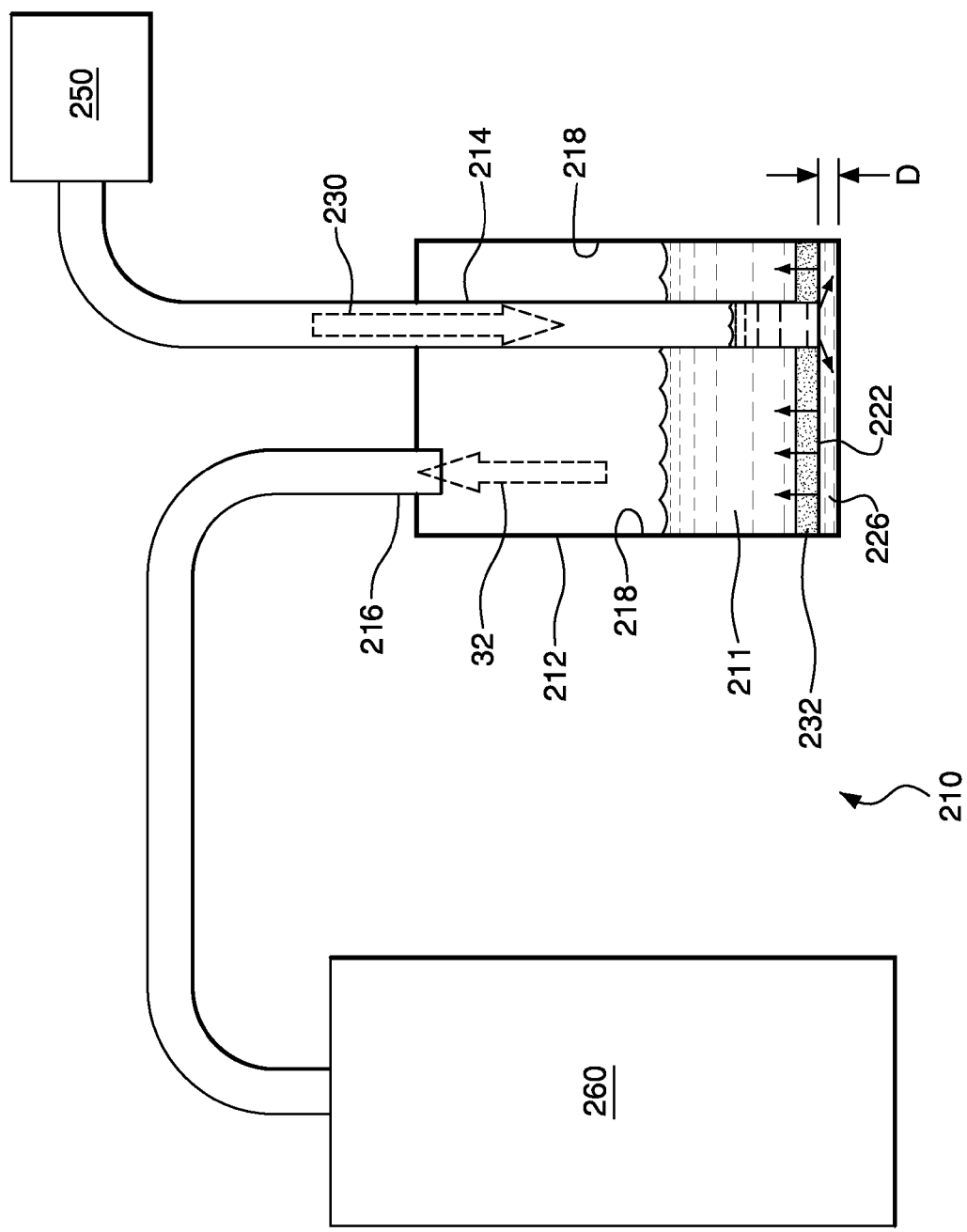
FIG. 2 shows an embodiment of a vaporizer apparatus according to the present invention.

Referring to FIG. 2, an exemplary chemical vapor deposition apparatus 210 is shown. CVD apparatus 210 includes an ampoule or vessel 212 containing a liquid reactant or precursor 211. The ampoule or vessel 212 may be cylindrical or any other suitable shape. As shown in FIG. 2, vessel 212 is a closed vessel bounded by interior walls 218 and bottom surface 222. The liquid reactant 211 is contained within a bottom portion of the vessel 212. Non limiting examples of liquid reactants include such as TEOS, trimethyl borate, tetraethyl borate, tetraethyl phosphate, tetraethyl phosphite, tetrakis (dimethylamino)titanium diethyl analog, water or the like is delivered from a liquid bulk delivery tank. Gas inlet conduit 214 provides an inlet port which is connected to a source 250 of carrier gas 230. The carrier gas may be stored in pressurized containers and the flow of the gas may be controlled by flow regulators and/or mass flow controllers as is known in the art.

A diffuser element 232, which may be in the form of a plate or a disk is inserted in the vessel 212 and extends between interior walls 218 and adjacent bottom surface 222. The distance "D" between the diffuser element 232 and bottom surface 222 according to one or more embodiments is less than about 2 mm. The outer diameter or other cross-sectional dimension of the diffuser element 232 is substantially equal to the inner diameter or other cross-sectional dimension of the vessel 212. As such, the diffuser element 232 can either be press fit or welded into the vessel and placed at the desired distance from the bottom surface 222 of the vessel so that the outer edges of the diffuser element 232 is in contact with the interior lateral walls of the vessel 212. The gap or spacing between the bottom surface 222 of the vessel 212 and the diffuser element 232 defines a plenum 226. Gas delivered into this plenum, being confined by the edge of the diffuser plate in contact with the walls, escapes mostly through the pores of the diffuser plate.

The diffuser element 232 is made from a porous material. An example of a porous material is a sintered frit. A sintered metal frit may be used to make the diffuser element 232. An example of a suitable sintered metal is stainless steel. Sintered stainless steel porous frits are available from Mott Corporation, Farmington, Conn. In one embodiment, the diffuser element is in the form of a disk having a diameter of about 5.75 inches, a thickness of about 0.078 inches and a pore size of about 40 microns. However, it will be understood that the present invention is not limited to a diffuser element having particular dimensions or pore size.

The diffuser element 232 is located in the lower portion of the vessel and submerged in the liquid reactant 211. Gas inlet conduit 214 extends beneath the level of liquid reactant 211 and through the diffuser element 232. Pressurized delivery of carrier gas 230 provides a mixture 32 of vaporized liquid precursor and carrier gas, which then exits the vessel 212 through outlet conduit or port 216, which is connected to a CVD chamber 260. It will be appreciated that one or more mass flow controllers or regulators may be connected between the vessel 212 and CVD chamber 260, which may be a conventional thermal or plasma-enhanced type. For example, such a chamber 260 is described in the following commonly owned issued U.S. Pat. No. 5,000,113, issued Mar. 19, 1991 to Adamik et al.; U.S. Pat. No. 4,668,365, issued May 26, 1987 to Foster et al.; U.S. Pat. No. 4,579,080, issued Apr. 1, 1986 to Benzing et al.; U.S. Pat. No. 4,496,609, issued Jan. 29, 1985 to Benzing et al. and U.S. Pat. No. 4,232,063, issued Nov. 4, 1980 to East et al., the disclosures of which are incorporated by reference herein.

In use, the CVD apparatus described immediately above can be used for the manufacture of films or layers on substrates, such as semiconductor substrates. Thus a chemical vapor deposition method includes flowing a carrier gas from a gas supply through the liquid reactant 211 via inlet conduit or tube 214. The flow of carrier gas through the liquid reactant causes the carrier gas and the liquid reactant to flow through the porous member to create a vapor from the liquid and transporting the vapor to a chamber under conditions to convert the liquid reactant to form a layer on a substrate contained within the chamber 260.

According to embodiments of the present invention, the use of a porous member extending across the cross section of the vessel 212 results in negligible microdroplet formation and incorporation in the mixed gas stream of carrier and liquid precursor vapor. This also permits more effective consumption of the liquid reactant by utilizing any remaining volume of the liquid precursor due to displacement of the liquid by the fritted disk, and the liquid is absorbed into the pores and microchannels of the porous member. This porous member displaces liquid into a fixed 2 mm gap or plenum between the bottom of the porous member and vessel or ampoule bottom surface.

Although the invention herein has been described with reference to particular embodiments, it is to be understood that these embodiments are merely illustrative of the principles and applications of the present invention. It will be apparent to those skilled in the art that various modifications and variations can be made to the method of the present invention without departing from the spirit and scope of the invention. Thus, it is intended that the present invention include modifications and variations that are within the scope of the appended claims and their equivalents.

What is claimed is:

1. A chemical vapor deposition method comprising:
    flowing a carrier gas through a gas inlet conduit to a bottom portion of a vessel defined by a wall and a bottom surface of the vessel, the vessel including the porous sintered metal frit extending between the wall of the vessel and defining a plenum in a bottom portion of the vessel, the gas inlet conduit passing through the porous sintered metal frit but not into the bottom portion of the vessel, the porous sintered metal frit being submerged in a liquid reactant contained between the wall of the vessel, causing the carrier gas and the liquid reactant to flow through the porous sintered metal frit to create a vapor from the liquid reactant; and
    transporting the vapor to a chamber under conditions such that the liquid reactant forms a layer on a substrate contained within the chamber.

2. The method of claim 1, wherein the porous sintered metal frit comprises includes stainless steel.

3. The method of claim 1, wherein the porous sintered metal frit is separated from the bottom of the vessel by less than about 2 mm.

4. The method of claim 1, wherein the porous sintered metal frit has a diameter of about 5.75 inches and a thickness of about 0.078 inches.

5. The method of claim 1, wherein the porous sintered metal frit has a pore size of about 40 microns.

6. The method of claim 1, wherein the liquid reactant is absorbed into pores and microchannels of the porous sintered metal frit.

7. A method of processing a substrate, the method comprising:
    flowing a carrier gas through an inlet conduit to a liquid reactant containing vessel;
    flowing the carrier gas and liquid reactant through a porous sintered metal frit creating a vapor from the liquid reactant; and
    flowing the vapor through an outlet conduit;
    wherein the porous sintered metal frit is immersed in the liquid reactant and positioned less than about 2 mm from a bottom of the vessel.

8. The method of claim 7, further comprising flowing the vapor to a processing chamber.

9. The method of claim 8, further comprising reacting the vapor with a substrate in the processing chamber to form a layer on the substrate.

10. The method of claim 7, wherein the porous sintered metal frit comprises stainless steel.

11. The method of claim 7, wherein the porous sintered metal frit has a diameter of about 5.75 inches and a thickness of about 0.078 inches.

12. The method of claim 7, wherein the porous sintered metal frit has a pore size of about 40 microns.

13. A deposition method comprising:
    flowing a carrier gas into a liquid reactant containing vessel having walls and a bottom surface;
    flowing the carrier gas and liquid reactant through a porous sintered metal frit extending between the walls of the vessel and defining a plenum in a bottom portion of the vessel, causing the carrier gas and the liquid reactant to flow through the porous sintered metal frit to create a vapor comprising the liquid reactant; and
    transporting the vapor to a chamber under conditions such that the liquid reactant forms a layer on a substrate contained within the chamber;
    wherein the porous sintered metal frit is separated from the bottom of the vessel by less than about 2 mm.

14. The method of claim 13, wherein the porous sintered metal frit is submerged in the liquid reactant.

15. The method of claim 13, wherein the porous sintered metal frit comprises includes stainless steel.

16. The method of claim 13, wherein the porous sintered metal frit has a diameter of about 5.75 inches and a thickness of about 0.078 inches.

17. The method of claim 13, wherein the porous sintered metal frit has a pore size of about 40 microns.

18. The method of claim 13, wherein the liquid reactant is absorbed into pores and microchannels of the porous sintered metal frit.

* * * * *